Oct. 6, 1970 R. D. WILLIAMS 3,532,000

WAVE SIGNAL TUNER MECHANISM

Original Filed March 29, 1967

INVENTOR
RUSSELL D. WILLIAMS

BY Mueller, Aichele & Rauner

ATTORNEYS.

3,532,000

WAVE SIGNAL TUNER MECHANISM

Russell D. Williams, Chicago, Ill., assignor to Motorola, Inc., Franklin Park, Ill., a corporation of Illinois Continuation of application Ser. No. 749,903, July 22, 1968, which is a continuation of application Ser. No. 626,764, Mar. 29, 1967. This application July 22, 1969, Ser. No. 847,522
Int. Cl. F16h *35/18*
U.S. Cl. 74—10.33 5 Claims

ABSTRACT OF THE DISCLOSURE

A tuning device which utilizes a plastic core carriage that is coupled by a linkage to the treadle mechanism of the tuner. The linkage includes V-shaped grooves at either end of the core carriage, and balls that are held in position in the respective V grooves by arms which are connected to the treadle mechanism. Rotating the treadle mechanism with the manual tuning knob or the push-buttons, drives the arms to slide the balls in the V grooves to convert the rotational movement of the treadle mechanism into linear movement of the core carriage.

This application is a continuation of application Ser. No. 749,903 filed July 22, 1968, which is a continuation of application Ser. No. 626,764 filed Mar. 29, 1967, both abandoned.

CROSS-REFERENCE TO RELATED PATENTS

The manual and pusbutton operation of the tuner of this invention is similar to that operation described in Pat. No. 2,793,531 issued to R. E. Thompson and assigned to the assignee of this application.

BACKGROUND OF THE INVENTION

This invention pertains generally to a wave signal tuning device and more particularly to a tuning device for a pushbutton radio receiver.

In the past different linkages used in coupling the treadle mechanism of a pushbutton radio tuning device with the core or tuner slug carriage have generally initiated some inaccuracies in tuning the radio receiver because of backlash in the linkage. The backlash is particularly noticeable as drift from a selected broadcast station after a few operations of a pushbutton which had been initially set to the station. Furthermore, previous carriages had been generally formed from material that exhibited good electrical conducting properties so that the core screws connecting the tuner cores to the core carriage had to be electrically isolated from the carriage by insulating grommets that not only increased assembly time but also added material costs to the tuner, as well as difficulty in initial core adjustments.

SUMMARY

It is an object of this invention to provide a tuning device for a wave signal receiver that greatly reduces backlash between the treadle mechanism and the core carriage of the tuner thereby permitting repeated accurate pushbutton tuning of a selected broadcast station.

It is a further object of this invention to provide a tuning device for a pushbutton radio that is relatively inexpensive to produce.

In one embodiment of this invention, the treadle mechanism of a tuning device is rotatably positioned, by either manual means, or by a pushbutton and a clutch mechanism that decouples the manual means from the treadle mechanism, to vary the tuner cores of adjustable reactance means in a radio receiver to tune the radio to a desired frequency. A core carriage of molded plastic is coupled by a linkage to the treadle mechanism and translates the rotating motion of the treadle mechanism into linear motion for positioning the tuner cores, which are connected by core screws directly to the plastic material. The linkage includes a V-shaped groove in each of the two ends of the core carriage, and a ball that is held under spring pressure in each of the grooves by arms connected to the treadle mechanism. When the treadle mechanism is rotated, the motion is translated through the arms to the balls which slide in the V-shaped grooves to move the core carriage in a linear direction thereby positioning the tuner cores to tune the radio to the desired frequency.

DETAILED DESCRIPTION

Figure 1:
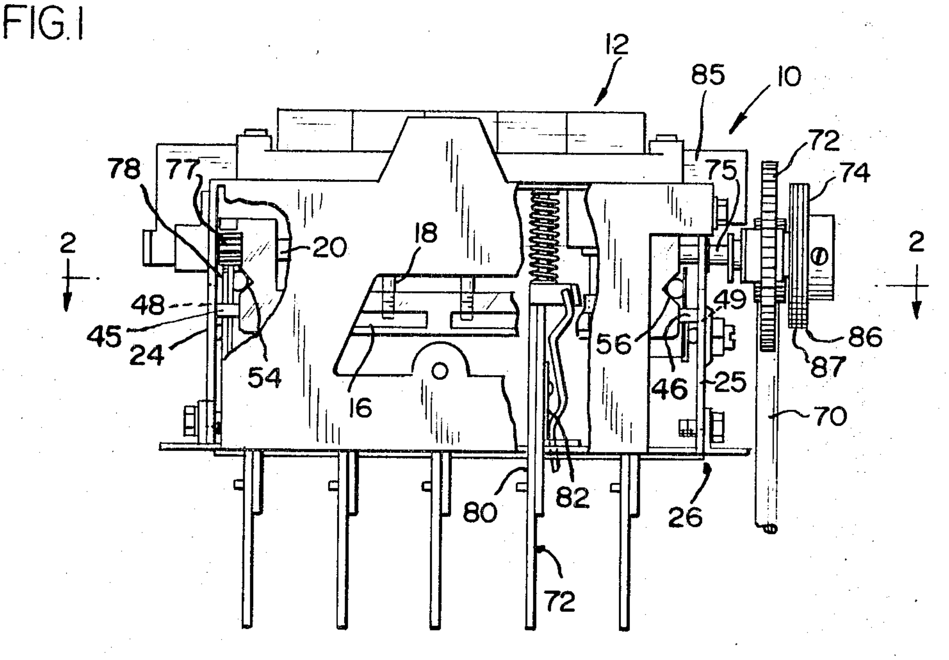
FIG. 1 is a top plan view illustrating a tuning device in accordance with this invention.
Figures 2, 3, 4:
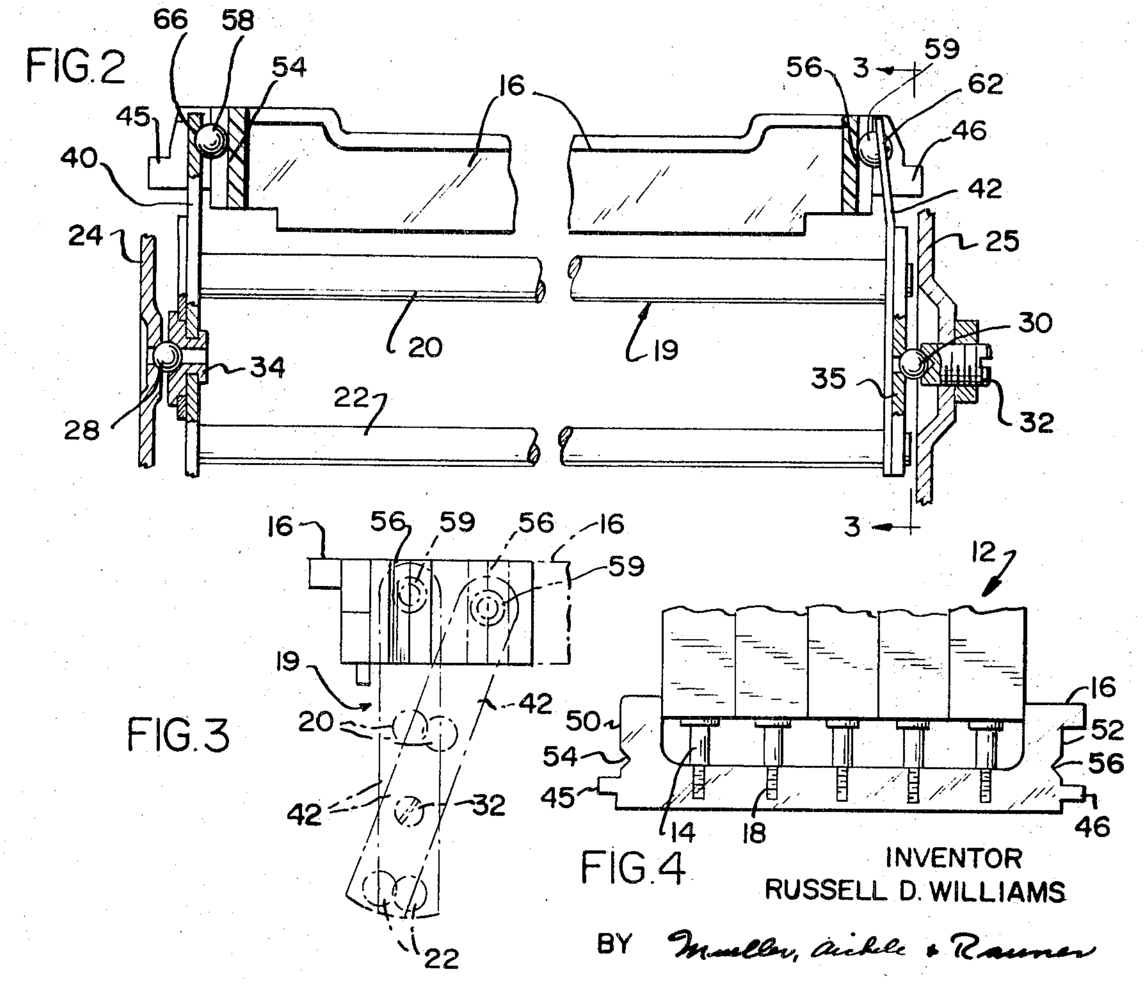
FIG. 2 is a side elevation cross-sectional view taken along the lines 2—2 of FIG. 1.
FIG. 3 is an end elevation view taken along the lines 3—3 of FIG. 2 and is partially shown in phantom and dotted lines to illustrate an operation of the device.
FIG. 4 is a top plan view of a portion of the device in accordance with this invention.

Referring to FIG. 1 of the drawing, there is shown a tuning apparatus 10 in which is included a plurality of slug or core tuned variable reactance units 12. The units 12 are incorporated in resonant circuits of a radio receiver and are variable to tune the radio receiver to a desired frequency. As shown in FIG. 4, the movable slugs or cores 14 of the units 12 are connected to a carriage member 16 by core screws 18.

The carriage 16 is molded in one piece from a good dielectric material such as plastic. The use of a dielectric material permits the core screws 18 to be screwed directly into the plastic thereby eliminating the need for insulating grommets which were generally used in prior art tuning devices, where the carriage was made of metal, to electrically isolate the cores 14 from the metal carriage. Elimination of these grommets has permitted more rapid assembly of the reactance units 12 to the carriage 16 and has also eliminated the cost of the grommets.

A treadle mechanism 19 including parallel treadle bars 20, and 22 is rotatably mounted to the end walls 24 and 25 of the tuner structure frame 26 by the balls 28 and 30. The set screw 32 is threaded through the wall 25 of the frame 26 and is used to seat the balls 28 and 30 into bushing 34, that is connected to the treadle mechanism 19 at one end, and into bushing 35, which is connected to the treadle mechanism 19 at the other end. The balls 28 and 30 are rotatably seated in the end wall 24 and the set screw 32, respectively, so that the treadle mechanism 19 is free to rotate within the tuner frame.

A linkage couples the treadle mechanism 19 to the carriage 16 and translates the rotational movement of the treadle mechanism 19 into linear movement for positioning the carriage 16 to vary the setting of the tuner cores 14. The linkage includes first and second arms 40 and 42 that are fastened to the treadle bars 20 and 22 respectively as shown in FIG. 3. The carriage 16 has first and second projections 45 and 46 that are mounted in and slide within slots 48 and 49 in the end walls 24 and 25 of the tuner frame 26. Also in each of the end walls 50 and 52 of the carriage 16 are V-shaped grooves 54 and 56. Spherical members or balls 58 and 59 complete the linkage. The linkage coupling the treadle mechanism 19 to the carriage 16 is assembled by positioning the balls 58 and 59 in the V-shaped grooves 54 and 56, respectively, of the carriage with the arms 40 and 42. To facilitate this assembly, the arm 42 is made of a resilient material in the form of a leaf spring. Therefore, when assembled, the resilient arm 42 biases the ball 58 between the arm 40 and the walls of the V-shaped groove 54, and ball 59 between the arm 42 and the walls of V-shaped groove 56. The balls 58 and 59 are seated in pockets 66 and 62 in the arms 40 and 42, respectively, but are free to slide vertically in each of the V-shaped grooves 54 and 56.

Operation of the linkage mechanism can be better understood by referring to FIG. 3 of the drawing. The arm 42, drawn in phantom, is shown in a vertical position corresponding to the position of the treadle mechanism 19. In this position the ball 59 rides relatively close to the top of the V-shaped groove 56 to position the carriage 16 as shown. Shown in dotted in the figure is the position of the arm 42 after the treadle mechanism 19 has been rotated clockwise to reposition that arm.

Movement of the arm 42 moves the ball 59 into a position relatively lower in the V-shaped groove 56 from its position with the arm 42 in the vertical. The downward movement of the ball 59 in the V-shaped groove caused the carriage 16 to move in a linear direction to a new position as shown in dotted in the figure. Therefore, the rotational movement of the treadle mechanism 19 has been translated through the arm 42 and the ball 59 sliding in groove 56 into linear movement of the carriage 16. It should be noted that the balls 58 and 59 engage each wall of the V grooves 54 and 56 as shown in FIG. 1, as they move vertically in an upward and downward direction within the groove. This is significant in that it basically eliminates backlash in translating the rotational movement of the treadle mechanism 19 into linear movement of the carriage 16, because the motion of the balls is transmitted directly to the walls of the V-shaped grooves.

In general operation of the radio, the treadle mechanism 19 is positioned by turning either the manual tuning shaft 70 or operating the pushbutton 72. A detailed description of a pushbutton radio receiver that operates in a manner similar to this one may be found in a patent to R. E. Thompson, No. 2,793,531 assigned to the assignee of this application. In brief, however, the shaft 70 may be rotated by a manual tuning knob, not shown, to drive gear 72 which rotates clutch mechanism 74 to rotate shaft 75. Rotation of shaft 75 drives the gear 77 which engages and drives a gear segment 78 coupled to the bar 20 of the treadle mechanism 19. Rotation of the gear segment 78 therefore rotates the treadle mechanism 19. This rotational movement is translated through the arms 40 and 42 to move the balls 58 and 59 in the V-shaped grooves 54 and 56, as explained, to linearly displace the carriage 16 thereby varying the position of the cores 14 to tune the radio to a desired frequency.

Operation of one of the pushbuttons 72 moves the plunger rod 80 until the presettable cam 82 strikes the bars 20 and 22 of the treadle mechanism 19 to rotate that mechanism in the known manner. Movement of the plunger rod 80 also causes displacement of the declutch bar 85 which operates to separate the clutch plates 86 and 87 thereby decoupling the manual tuning shaft 70 from the shaft 75. As the treadle mechanism 19 is rotatably displaced by the pushbutton 72, the rotary motion is once again translated by the described linkage to linearly move the carriage 16 to position the cores 14 to tune the radio to the present broadcast station.

There has been a problem in the past with pushbutton operation of radio receivers in that the linkage coupling the treadle mechanism to the core carriage has had a certain amount of backlash in it so that repeated operation of a pushbutton causes the radio receiver to be slightly mistuned from the desired broadcast station to which the button is set. With this device, however, because the arms 40 and 42 are directly connected to the treadle mechanism 19, and the balls 58 and 59 engage the walls of the groove 54 and 56 there is for practical purposes no loss motion or backlash between the rotation of the treadle mechanism 19 and the carriage 16 so that the pushbutton always tunes the radio receiver to the preselected station.

What has been described, therefore, is an economical tuning device for a pushbuton radio receiver that greatly reduces backlash between the treadle mechanism and the core carriage so that with continued pushbutton operation the radio receiver will accurately turn to the desired preset station.

What is claimed is:

1. In wave signal tuning apparatus of the type having movable means for adjusting a variable reactance device, the combination including carriage means movably coupled to the variable reactance device, rotating means, means adapted to be coupled to said rotating means for moving the same, and linkage means coupling said rotating means to said carriage means for translating the rotational motion of said rotating means into straight line motion for positioning said carriage means, said linkage means including a V-shaped groove in one of said carriage and said rotating means, and a ball coupled to the other one of said carriage means and said rotating means and slidably movable in said groove, whereby movement of said rotary means causes movement of said ball in said V-shaped groove to position said carriage means.

2. In a tuner for use with a radio receiver having adjustable reactance means and having a treadle mechanism rotatably positioned by manual tuning means and automatically positioned by the combination of a pushbutton means and a clutch mechanism that decouples the manual tuning means from the treadle mechanism, the treadle mechanism being rotated to position the reactance means to control the tuning of the receiver within a frequency range, the combination including, a carriage coupled to the reactance means and having first and second end portions, said carriage being movable in a substantially linear direction, linkage means coupling the treadle mechanism to said carriage, said linkage means including first and second arms connected to the treadle mechanism, a V-shaped groove in each end portion of said carriage, and a ball movably positioned in each said V-shaped groove by a respective arm, so that rotation of the treadle mechanism is transmitted through said arms to move said balls in said V-shaped grooves thereby positioning the carriage to tune the radio to a selected frequency.

3. In a tuner of claim 2 wherein one of said first and second arms is a leaf spring, said leaf spring biasing said balls into each said V-shaped grooves.

4. In a tuner of claim 2 further including a frame having end walls and having an elongated slot in each wall, and wherein said carriage has first and second projections extending into and being slidably movable in a linear direction in said slots, so that rotation of the treadle means is translated by said balls moving in said V-shaped grooves of said carriage to slide the same in the slots in a linear direction to position the carriage to tune the radio to a selected frequency.

5. In a tuner of claim 2 further including said carriage being of a molded dielectric material, and fasteners threading the reactance means directly into the carriage so that movement of said carriage adjusts said reactance means to tune the receiver to a given frequency.

References Cited

UNITED STATES PATENTS

| | | | |
|---|---|---|---|
| 2,050,960 | 8/1936 | Olivetti. | |
| 2,318,572 | 5/1943 | Cramer | 74—10.33 |
| 2,537,195 | 1/1951 | Stoeckig | 74—50 |
| 2,774,837 | 12/1956 | Grover | 200—67 |
| 3,192,781 | 7/1965 | Lyon | 74—10.31 |
| 3,353,874 | 11/1967 | Del Vecchio et al. | 308—3.8 |

MILTON KAUFMAN, Primary Examiner

U.S. Cl. X.R.

74—104, 110.